(12) United States Patent
Jiang et al.

(10) Patent No.: US 7,005,901 B1
(45) Date of Patent: Feb. 28, 2006

(54) PROCESS, TEMPERATURE AND SUPPLY INSENSITIVE TRAPEZOIDAL PULSE GENERATOR

(75) Inventors: Yi Jiang, Irvine, CA (US); Raed Moughabghab, Laguna Niguel, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/927,709

(22) Filed: Aug. 27, 2004

(51) Int. Cl.
 *H03K 4/94* (2006.01)
(52) U.S. Cl. ..................................................... 327/130
(58) Field of Classification Search ........ 327/126–127, 327/130–132
See application file for complete search history.

(56) References Cited

U.S. PATENT DOCUMENTS

| 6,130,989 | A  | * | 10/2000 | Mizumoto et al. | .......... 388/815 |
| 6,518,803 | B1 | * | 2/2003 | Nagata et al. | .............. 327/108 |
| 6,545,513 | B1 | * | 4/2003 | Tsuchida et al. | ............ 327/108 |

* cited by examiner

*Primary Examiner*—My-Trang Nu Ton
(74) *Attorney, Agent, or Firm*—Akin Gump Strauss Hauer & Feld LLP

(57) ABSTRACT

A process, temperature and supply insensitive trapezoidal pulse generator includes a stable reference current source for generating a stable reference current. The trapezoidal pulse generator includes a current amplification circuit adapted to receive the stable reference current and operable responsive to the stable reference current to amplify the stable reference current to a mirrored current. The trapezoidal pulse generator includes an output circuit coupled to the current amplification circuit and adapted to receive the mirrored current and operable in a second frequency to generate a trapezoidal pulse.

32 Claims, 5 Drawing Sheets

PROCESS, TEMPERATURE AND SUPPLY INSENSITIVE TRAPEZOIDAL PULSE GENERATOR

TECHNICAL FIELD

The present invention relates generally to communications systems, and more specifically to a process, temperature and supply insensitive trapezoidal pulse generator.

BACKGROUND OF THE INVENTION

In modern communication systems trapezoidal pulse generators are used to shape a signal prior to transmission. A trapezoidal pulse generator converts a digital signal into an analog signal, which is necessary for transmission via a cable or an optical fiber.

FIGS. 1 and 2 illustrate a typical transmitter and a receiver, respectively, of a wireline communication system. The blocks in the transmitter 100 and receiver 200 are connected differentially as indicated by the double lines. Referring now to FIG. 1, a transmitter 100 includes a jitter attenuator 104, a digital encoder 108, a phase locked loop 112, a trapezoidal pulse generator 116 and a line driver 120.

In operation, a clock signal and data are provided to the jitter attenuator 104. The jitter attenuator 104 removes unwanted jitter from the clock signal, and synchronizes the data and the clock signal. The jitter attenuator 104 provides the data to the digital encoder 108. The digital encoder 108 encodes the data according to a standard coding scheme.

The jitter attenuator 104 provides the clock signal to the phase locked loop 112. The phase locked loop 112 multiplies the frequency of the clock signal by an integer number. The clock signal's frequency is multiplied by an integer in order to meet the over-sampling requirement of the trapezoidal pulse generator 116. In this case, the phase locked loop 112 multiplies the clock signal by 4, i.e., increases the clock frequency by 4. The multiplied clock signal is received by the trapezoidal generator 116. The trapezoidal generator 116 also receives the encoded data from the encoder 108.

As mentioned before, the trapezoidal pulse generator 116 converts the digital signal into an analog signal that is suitable for transmission via a cable or optical fiber. Specifically, the trapezoidal pulse generator 116 converts a digital signal, which is a train of square waves, into a trapezoidal shaped signal. The output of the trapezoidal pulse generator 116 is received by a line driver 120. The line driver 120 drives the resistive load of a media 124 such a coaxial cable. In other words, the line driver transmits the analog signal over the coaxial cable 124. In the description that follows, the media 124 will be referred to as the coaxial cable.

Referring now to FIG. 2, a receiver 200 includes a variable gain amplifier (VGA) 204, an equalizer 208, a peak detector (PD) 216, a slicer 240, an analog offset controller (AOC) 212, a clock and data recovery circuit (CDR) 220, an automatic equalizer control (AEC) 224, an analog gain controller (AGC) 228, and a digital decoder 232.

The signal transmitted over a cable 202 is received by the receiver 200. The VGA 204 amplifies the signal to compensate for the frequency-independent loss, also known as resistive loss or flat loss.

The output of the VGA 204 is received by the equalizer 208. The equalizer 208 compensates for the frequency-dependent loss on the cable also known as cable loss. The equalizer 208 boosts the high frequency components of the signal to compensate for the cable loss.

The output of the equalizer 208 is received by the PD 216. In general, the PD 216, which receives an analog output from the equalizer 208, determines the peak of the equalized signal. The output of the equalizer 208 is also received by the AOC 212, which controls through the VGA 204 the differential offset of the receiver. Thus, the AOC 212 forms a feedback loop to adjust through the VGA 204 the differential offset of the receiver, driving the differential offset to 0 V level. The differential offset of the receiver is driven to a 0 V level in order to eliminate harmonic distortion inside the receiver 200.

As discussed before, the output of the equalizer 208 is received by the PD 216. The peak detector determines the peak of the equalized signal (i.e., the output of the equalizer 208) and sends the peak value to the slicer 240. The slicer 240 also receives the output of the equalizer 208. The slicer 240 functions as an analog to digital converter (e.g., a 2 bit A/D converter), which outputs a digital signal using the peak value.

The digital output of the slicer 240 is received by the CDR 220. The CDR 220 extracts the correct clock signal and data from the digital signal and also synchronizes the data and the clock signal. The output of the CDR 220 is received by the decoder 232, which decodes the signal according to a standard decoding scheme.

The analog output of the PD 216 is received by the AGC 228, which controls the gain of the VGA 204. The digital output of the slicer 240 and the output of the CDR 220 are received by the AEC 224, which controls the gain of the equalizer 208 by adjusting the equalizer coefficients or steps.

The trapezoidal pulse generator is now described in detail. FIG. 3 illustrates a conventional trapezoidal pulse generator 300. The trapezoidal pulse generator 300 comprises a current mirror, which is switched in order to charge and discharge an output capacitor. A reference current Iref 304 is mirrored 1:N using a two-stage current mirror formed by transistors 308, 312, 316, 320 and 324. The current through transistors 312 and 316 is $I_{ref}$, while the current through transistors 320 and 324 is $N*I_{ref}$. Switches 328 and 332 are operated in a complementary manner to charge and discharge an output capacitor 336, also referred to as $C_{out}$.

The waveform generated by the trapezoidal pulse generator 300 is shown in FIG. 4. During a first phase (i.e., t0<t<t1), the switch 328 is closed and the switch 332 is opened. During the first phase, the capacitor 336 is charged by the current $N*I_{ref}$ to a voltage $V_{out}$. During a second phase (i.e., t1<t<t2), the switches 328 and 332 are opened. During the second phase, the capacitor 336 holds the voltage $V_{out}$. During a third phase (i.e., t2<t<t3), the switch 332 is closed and the switch 328 is opened. During the third phase, the capacitor 336 discharges through the transistor 324. During a fourth phase (i.e., t3<t<t4), the switches 328 and 332 are opened. During the fourth phase, the capacitor 336 holds the voltage $V_{out}$. The rate at which the capacitor 336 is charged and discharged determines the slope of the rising edge and falling edge, respectively, of the trapezoidal pulse.

Consider the capacitor 336 being initially not charged. $V_{out}$ can be represented by the following equations:

During the first phase, $V_{out}=(N*I_{ref})*t/C_{out}$ (0<t<t1)  (1)

During the second phase, $V_{out}=(N*I_{ref})*t1/C_{out}$ (t1<t<t2)  (2)

During the third phase, $V_{out}=(N*I_{ref})*(t1-t)/C_{out}$ (t2<t<t3)  (3)

During the fourth phase, $V_{out}=(N*I_{ref})*(t1-t3)/C_{out}$ (t3<t<t4)  (4)

From the foregoing, it is evident that a variation in the capacitance and $I_{ref}$ will cause $V_{out}$ to vary. The capacitance of a capacitor can vary depending on changes in temperature or process. Also, a variation in the value of a resistor will cause $I_{ref}$ to vary. FIG. 5 illustrates a typical circuit for generating $I_{ref}$. A resistor $R_{ref}$ is connected in series with a band-gap voltage $V_{bg}$ and ground. The current $I_{ref}$ through the resistor $R_{ref}$ is equal to $V_{bg}/R_{ref}$. While $V_{bg}$ can be accurately controlled, the resistance value of $R_{ref}$ can vary depending on changes in temperature or process. Thus, a variation in the value of $R_{ref}$ due to differences in process or temperature can cause variation in $I_{ref}$.

Since $V_{out}$ varies with the variation in $I_{ref}$ and $V_{out}$, the shape of the trapezoidal pulse will vary. The variation in $I_{ref}$ and $C_{out}$ are not similar. Since $R_{ref}$ and $C_{out}$ are manufactured from different materials, due to a variation in process or temperature, $R_{ref}$ may increase in value while $C_{out}$ may decrease in value. Thus, the variation in $I_{ref}$ and $C_{out}$ causes uncertainty in the trapezoidal pulse shape. The variation in the shape of the trapezoidal pulse may be substantial enough to cause the waveform to fall out of a required template causing error in the data bits.

SUMMARY OF THE INVENTION

According to one aspect of the invention, an improved trapezoidal pulse generator includes a stable current source for generating a stable reference current. In one embodiment, the trapezoidal pulse generator includes a switched capacitor circuit coupled to two voltage sources and operable in a first frequency to generate a stable reference current. The trapezoidal pulse generator includes a current mirror circuit adapted to receive the stable reference current and operable responsive to the stable reference current to amplify the stable reference current to a mirrored current. The trapezoidal pulse generator includes an output circuit coupled to the mirror circuit and adapted to receive the mirrored current and operable in a second frequency to generate a trapezoidal pulse.

The switched capacitor circuit includes a first switch and a second switch coupled to the voltage sources. The first and second switches are operable responsive to a first and a second clock signal, respectively, operating in the first frequency to alternately charge and discharge a first capacitor and to generate the stable reference current. The capacitance of the first capacitor is adjusted to control the magnitude the stable reference current.

The switched capacitor circuit further includes a first transistor coupled between an operational amplifier circuit and the first switch. The first transistor adapted to receive a dc voltage from the operational amplifier circuit at its gate, and operable responsive to the dc voltage at its gate to provide a current signal to the first switch.

The output circuit comprises a third and a fourth switch coupled to an output capacitor. The third and fourth switches are operable responsive to a third and a fourth clock signal, respectively, to alternately charge and discharge an output capacitor.

DETAILED DESCRIPTION OF THE INVENTION

The invention reduces the variation of the trapezoidal pulse by removing the uncertainty caused by variation in $I_{ref}$ and $C_{out}$. According to the invention, a stable reference current is first generated. In one embodiment, a stable reference current $I_{ref}$ is generated using a switched capacitor circuit. The switched capacitor circuit comprises two switches and a capacitor. Since the variation in $I_{ref}$ is primarily caused by a resistor, the variation in $I_{ref}$ is reduced by eliminating the resistor.

Figure 6:
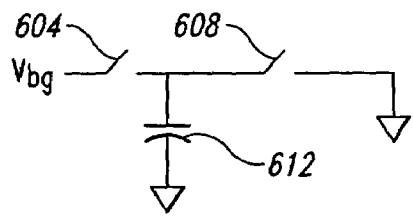
FIG. 6 illustrates a switched capacitor circuit used to generate $I_{ref}$.

FIG. 6 illustrates a switched capacitor circuit that is used in the invention to generate an $I_{ref}$. A pair of switches 604 and 608 and a capacitor 612 are connected as shown to form a switched capacitor circuit. The switches 604 and 608 are operated in a complementary manner. The switched capacitor circuit can be modeled as a resistor and has an equivalent resistance R=1/(fC), where, f is the switching frequency and C is the capacitance.

During a first time period T1, the switch 604 is closed and the switch 608 is opened, and the capacitor 612 is charged to Q1=C*$V_{bg}$. During a second time period T2, the switch 604 is opened and the switch 608 is closed, and the capacitor 612 is discharged to ground. During the total time period T, where T=T1+T2, the average charge variation on the capacitor 612 is Q=Q1−Q2=(C*$V_{bg}$−0)=C*$V_{bg}$.

Since the current in the capacitor is I=dQ/dt, where dQ=Q1−Q2=C*$V_{bg}$ and dt=T, we have $$I=C*V_{bg}/T \qquad (5)$$

As discussed before, the reference current in a conventional current mirror is represented by $I_{ref}=V_{bg}/R$ . . . (6).

A comparison of (5) and (6) reveals that the effective resistance of the switched capacitor circuit is R=T/C, and $I_{ref}=C*V_{bg}/T$. Thus, $I_{ref}$ is a function of $V_{bg}$, T and C.

The time period T and $V_{bg}$ can be accurately controlled. However, the capacitor C will be subject to variation. Thus, the reference current generated using the switched capacitor circuit is still dependent on the accuracy of the capacitor C.

Figure 7:
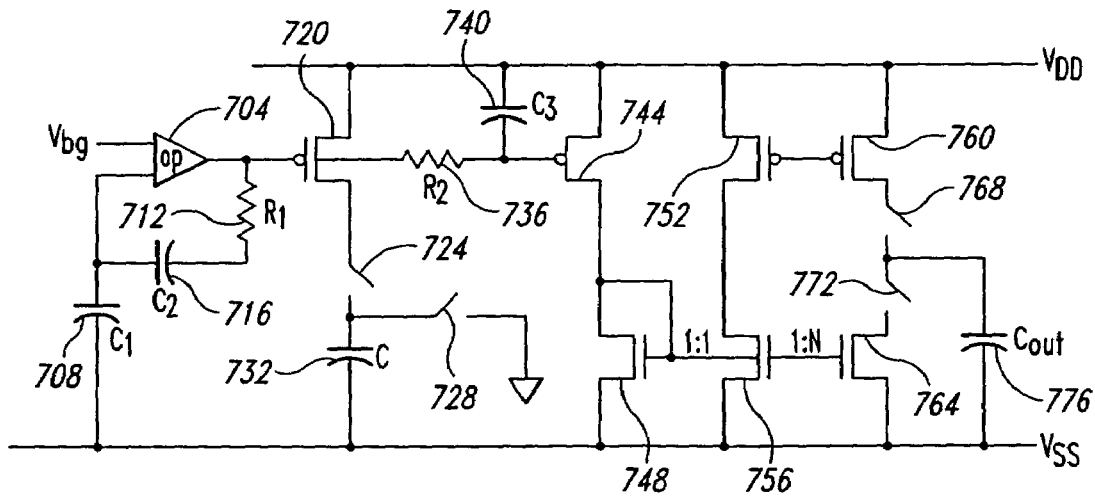
FIG. 7 illustrates a trapezoidal pulse generator in accordance with an embodiment of the invention.

According to one aspect of the invention, the reference current generated by the switched capacitor circuit is used to generate a trapezoidal pulse on an output capacitor. FIG. 7 illustrates a trapezoidal pulse generator in accordance with one embodiment of the invention. A relatively stable $I_{ref}$ is generated using a switched capacitor circuit comprising op-amp 704, capacitors 708, 716, 732 and 740, resistor 712, switches 724 and 728, and transistor 720. A band-gap voltage $V_{bg}$ is applied to the op-amp 704. The output of the op-amp 704 is applied to gate of the transistor 720, which provides a current signal to the switch 724. The switches 724 and 728 operate with a period T in a complementary manner to charge and discharge the capacitor 732. The average current in the capacitor 732 is $I_{ref}$ and is considered a relatively stable current.

The current $I_{ref}$ is mirrored into a current mirror circuit comprising the transistors 744, 748, 752, 756, 760 and 764. The current mirror circuit amplifies the current into N*$I_{ref}$ As shown in FIG. 7, the current in the transistors 744, 748, 752 and 756 is $I_{ref}$, while the current in the transistors 760 and 764 is $N*I_{ref}$.

The switches 768 and 772 and the capacitor 776 are coupled to the current mirror circuit. The switches 768 and 772 operate in a complementary manner to charge and discharge the output capacitor 776. The switches 768 and 772 have a period t.

Figure 1:
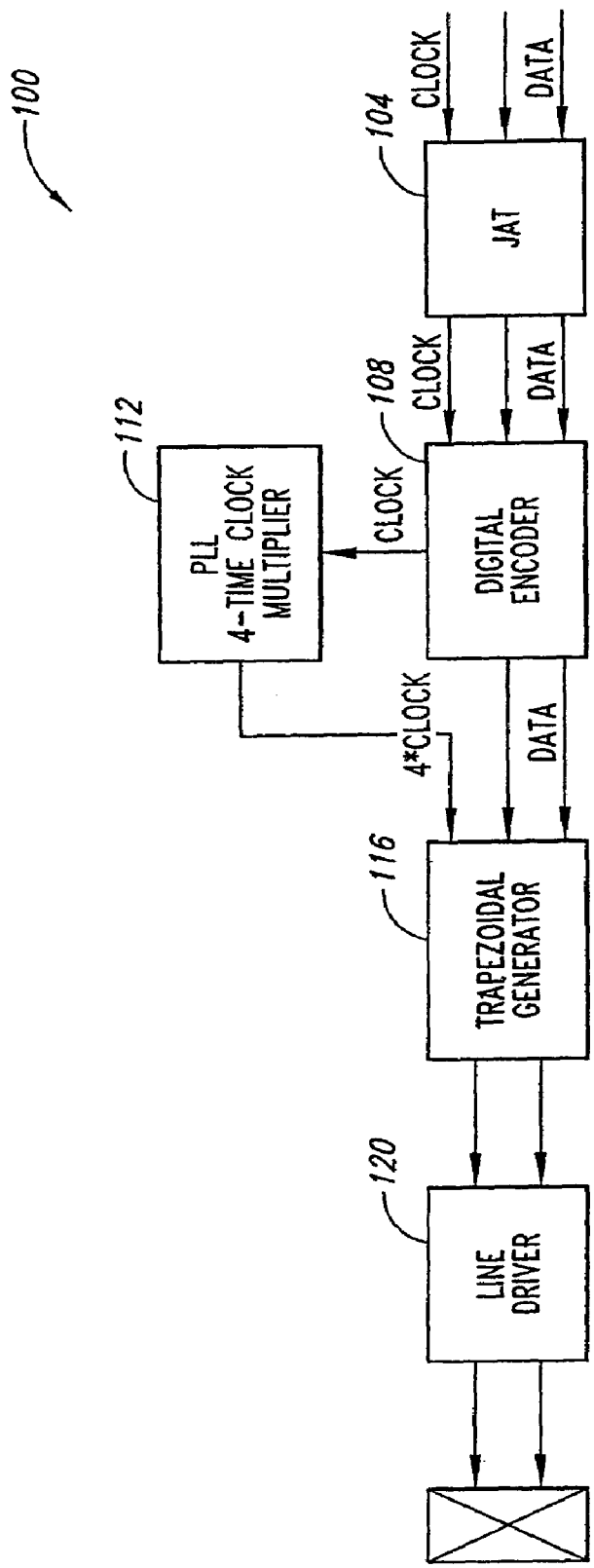
FIGS. 1 and 2 illustrate a typical transmitter and receiver blocks, respectively, of a wireline communication system.
Figure 2:
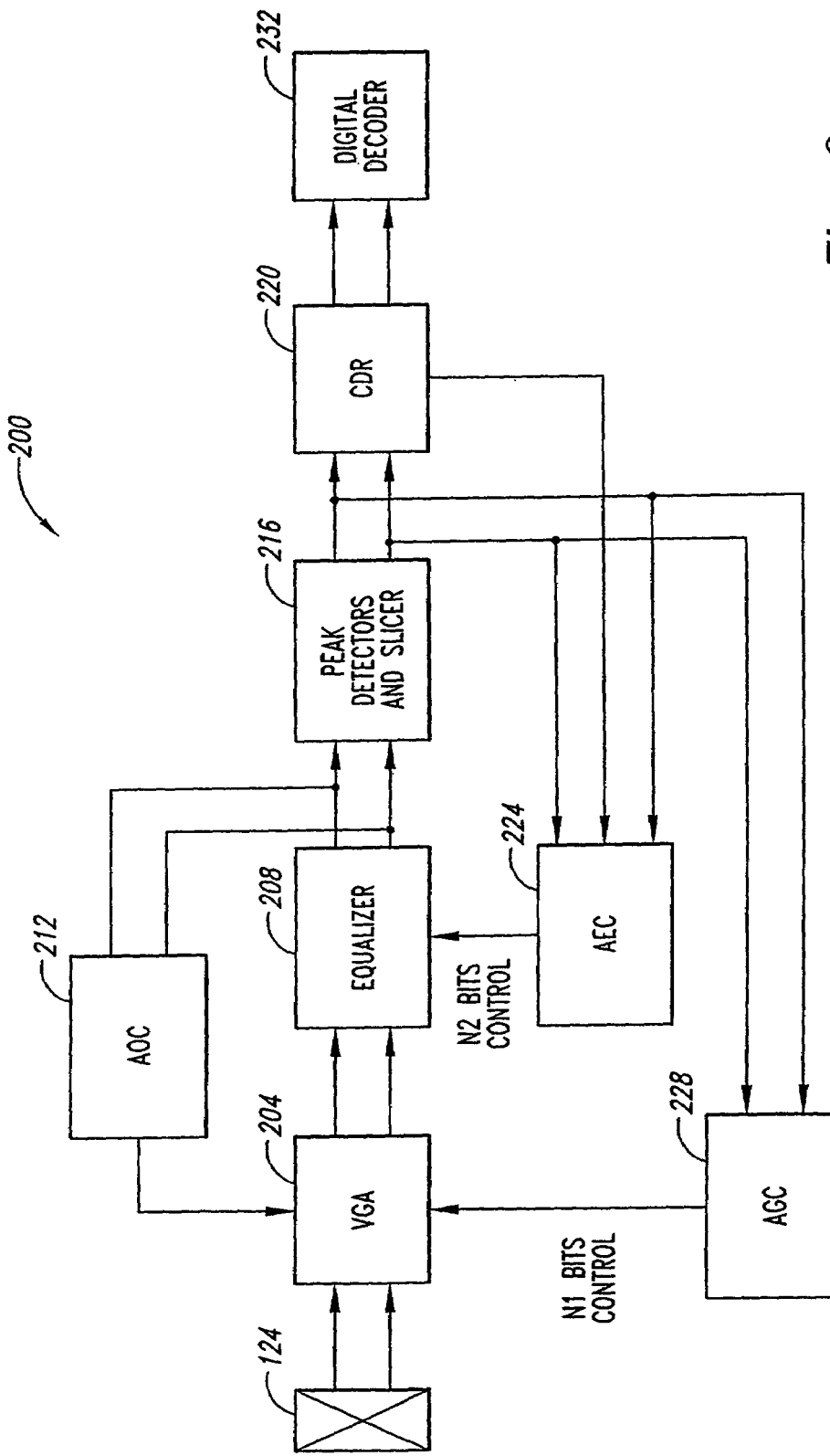
Figure 3:
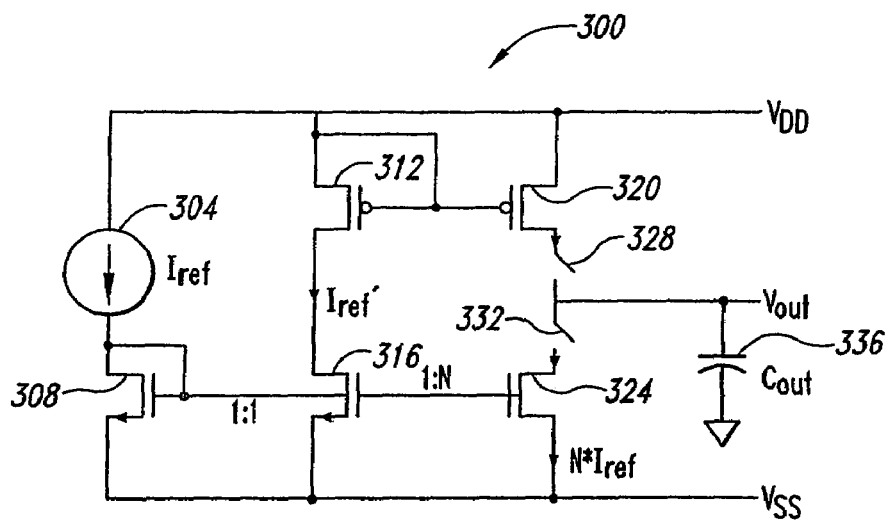
FIG. 3 illustrates a conventional trapezoidal pulse generator.
Figure 4:
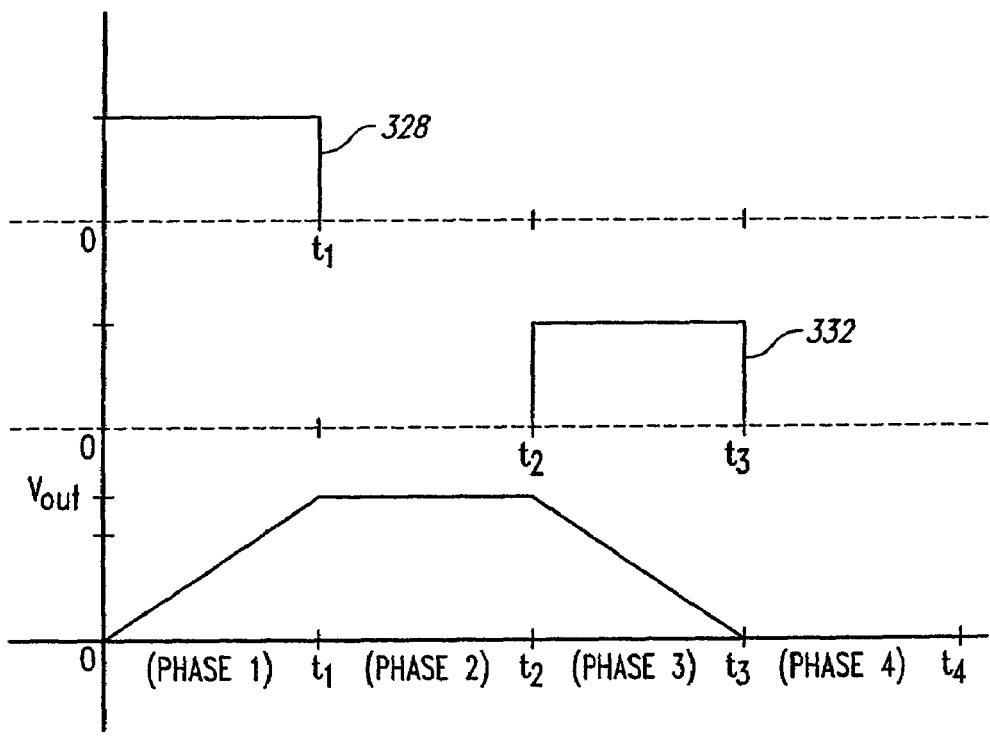
FIG. 4 illustrates the output and switching waveforms of the trapezoidal pulse generator.
Figure 5:
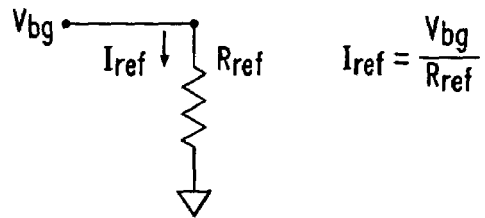
FIG. 5 illustrates a typical circuit for generating $I_{ref}$.

The operation of the switches 768 and 772 and the output voltage is similar to the illustrations in FIG. 4 except the output voltage is controlled more accurately. Thus the operation of the switches 768 and 772 will be described with reference to FIG. 4. During a first phase, the switch 768 is ON and the switch 772 is OFF. During the first phase, the capacitor 776 is charged to the output voltage $V_{out}$. During a second phase, the switches 768 and 772 are OFF. During the second phase, the capacitor 776 retains the voltage $V_{out}$. During a third phase, the switch 772 is ON and the switch 768 is OFF. During the third phase, the capacitor discharges the voltage $V_{out}$ to ground potential. During a fourth phase, both switches are OFF, and the capacitor voltage remains at ground potential.

As discussed before, the invention reduces the variation in the capacitance and the reference current, thus creating a stable output voltage. The advantages of the invention are demonstrated below by substituting $I_{ref}=C*V_{bg}/T$ in the equations (1)–(4):

During the first phase, $V_{out}=(N*I_{ref})*t/C_{out}=N*(C/C_{out})*(t/T)*V_{bg}(0<t<t1)$ (7)

During the second phase, $V_{out}=(N*I_{ref})*t1/C_{out}=N*(C/C_{out})*(t1/T)*V_{bg}(t1<t<t2)$ (8)

During the third phase, $V_{out}=(N*I_{ref})*(t1-t)/C_{out}=N*(C/C_{out})*((t1-t)/T)*V_{bg}(t2<t<t3)$ (9)

During the fourth phase, $V_{out}=(N*I_{ref})*(t1-t3)/C_{out}=N*(C/C_{out})*(t1-t3)/T)*V_{bg}(t3<t<t4)$ (10)

In the above equations (7)–(10):

$V_{out}$ is the output capacitor;

C is the capacitor of the switched capacitor circuit;

t is the period of the switches in the output circuit; and

T is the period of the switched capacitor circuit.

The waveform $V_{out}$ in equations (7)–(10) can be controlled accurately because of the following reasons:

(i) C and $V_{out}$ can be manufactured using the same process, such as, for example a semiconductor fabrication process or any other process in which C and $V_{out}$ are manufactured, and thus any variation in the ratio of $C/V_{out}$ can be minimized. In fact, by using the same process the ratio of $C/V_{out}$ can controlled within 0.1% accuracy.

(ii) $V_{bg}$ can be controlled accurately.

(iii) The ratio t/T can be chosen.

As described before, the output waveform $V_{out}$ can be described as $V_{out}=N*(C/V_{out})*(t/T)*V_{bg}$. Since $V_{bg}$, t/T and $C/V_{out}$ can all be accurately controlled, they contribute little error in $V_{out}$. The secondary effect of the mismatch in the current mirror, which mirrors the accurate reference current $I_{ref}$ to $N*I_{ref}$ to charge/discharge the output capacitor dominates. The error due to the mismatch in the current mirror is reflected by the variation in N in the equations (7)–(10).

Figure 8:
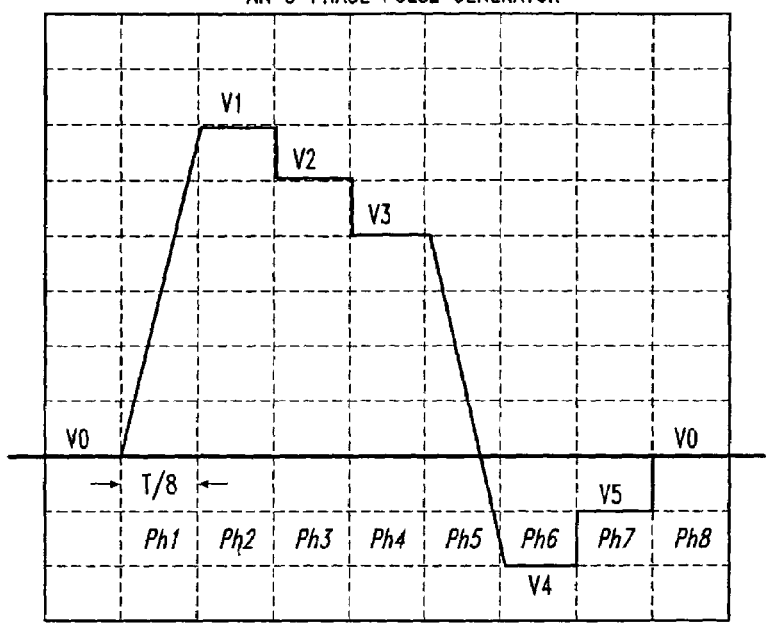
FIG. 8 shows the output of a trapezoidal pulse generator having 8 clock phases.

The trapezoidal pulse generator may be implemented having higher than four clock phases so that the resulting pulse may have finer steps. The output waveform of a trapezoidal pulse generator having 8 clock phases ($N_\Phi=8$) is illustrated in FIG. 8. A phase locked loop is used to generate an 8 phase clock, and in each phase, either charge, discharge or hold action operation is performed, resulting in a pulse with finer steps.

Referring now to FIG. 8, during the first phase, Cout is charged from V0 to V1. During the second phase, Cout holds the voltage at V1. During the third phase, $V_{out}$ is discharged to V2. During the fourth phase, Cout is discharged to V3. During the fifth phase, Cout is at V4. During the sixth phase, Cout holds the voltage at V4. During the seventh phase, Cout is at V5. During the eighth phase, Cout is at V0. Note that additional reference voltages (V2, V3, V4 and V5) are required for the additional steps in the pulse.

In a conventional trapezoidal pulse generator circuit, the mismatch in the current mirror is caused by the mismatch in the sizes of the mirrored pair of transistors and the mismatch of the output impedance of the transistors. The mismatch in the current mirror contributes to the deviation of the output waveform from an ideal case. With the careful design and selection, including selecting transistors having a large size and long channel length, the effect of the mismatch can be reduced. The error introduced by the mismatch is greater than the errors introduced by the clock, $V_{bg}$ or mismatch in capacitors. Thus, a reduction in the mismatch in the mirror circuit will significantly increase the overall accuracy. Another source of inaccuracy is due to the fact that the switches suffer from small leakage current. Although the leakage current is small, it is not desirable.

The trapezoidal pulse generator of FIG. 7 provides a solution to the above problems by incorporating a digital correction circuitry. The mismatch in current mirror is reduced by adding (or subtracting) an array of small capacitors to the capacitor 732.

If the output current $N*I_{ref}$ is less than desired (because of the variation in N due to mismatch and leakage), the capacitance C is increased by adding capacitors. If the current N*Iref is larger than desired, the capacitance is decreased by removing capacitors. A digital circuit to add and remove capacitors to the capacitor 732 is well understood by those skilled in the art.

In one embodiment of the invention, a differential circuit is used to reject common mode noise. Two identical trapezoidal pulse generators are used to obtain differential outputs, such that while one capacitor is being charged, the other output capacitor is being discharged. The differential output is taken as the final output. The differential circuit improves the common mode noise rejection and also reduces the output swing of the current source by 50%, which is significant given the low supply operation (AVDD=1.8±5%), while maintaining the same total output operation range. For example, if each output has a swing of 1V, then the differential output is 2V. A larger output swing provides a larger dynamic range and an improved noise immunity. In a single ended implementation, the output swing is limited by the power supply voltage. Thus, the dynamic reach of a single ended implementation is less than the differential implementation.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A trapezoidal pulse generator, comprising:
   a switched capacitor circuit coupled to a voltage source and operable in a first frequency to generate a stable reference current;
   a current mirror circuit adapted to receive the stable reference current and operable responsive to the stable reference current to amplify the stable reference current to a mirrored current; and
   an output circuit coupled to the mirror circuit and adapted to receive the mirrored current and operable in a second frequency to generate a trapezoidal pulse.

2. The trapezoidal pulse generator of claim 1 wherein the switched capacitor circuit comprises a first switch and second switch coupled to the voltage source, the first and second switch operable responsive to a first and second clock signal, respectively, operating in the first frequency to alternately charge and discharge a first capacitor and to generate the stable reference current.

3. The trapezoidal pulse generator of claim 1 wherein the switched capacitor circuit further comprises a first transistor coupled between an operational amplifier circuit and the first switch, the first transistor adapted to receive a dc voltage from the operational amplifier circuit at its gate, and operable responsive to the dc voltage at its gate to provide a current signal to the first switch.

4. The trapezoidal pulse generator of claim 2 wherein the first and second switch are operated in a complementary manner to charge and discharge the first capacitor.

5. The trapezoidal pulse generator of claim 2 wherein the capacitance of the first capacitor is adjusted to control the magnitude of the stable reference current.

6. The trapezoidal pulse generator of claim 3 wherein the operational amplifier circuit is adapted to receive a band gap voltage and operable responsive to the band gap voltage to apply dc voltage to the gate of the first transistor.

7. The trapezoidal pulse generator of claim 1 wherein the output circuit comprises a third and fourth switch coupled to an output capacitor, the third and fourth switch operable responsive to a third and fourth clock signal, respectively, to alternately charge and discharge the output capacitor.

8. The trapezoidal pulse generator of claim 7 wherein the third and fourth clock signal operate in the same frequency.

9. The trapezoidal pulse generator of claim 7 wherein the third switch is operable responsive to the third clock signal during a first phase to turn ON to charge the output capacitor.

10. The trapezoidal pulse generator of claim 7 wherein during a second phase the third and fourth switches are turned OFF and wherein the output capacitor holds the charge.

11. The trapezoidal pulse generator of claim 7 wherein the fourth switch is operable responsive to the fourth clock signal during a third phase to turn ON to discharge the output capacitor.

12. The trapezoidal pulse generator of claim 7 wherein during a fourth phase the third and the fourth switches are turned OFF.

13. A transmitter circuit for a communication system comprising:
   a jitter attenuator circuit;
   a digital encoder circuit;
   a phase locked loop circuit;
   a line driver circuit; and
   a trapezoidal pulse generator circuit comprising:
      a switched capacitor circuit coupled to a voltage source and operable in a first frequency to generate a stable reference current;
      a current mirror circuit adapted to receive the stable reference current and operable responsive to the stable reference current to amplify the stable reference current to a mirrored current;
      an output circuit coupled to the mirror circuit and adapted to receive the mirrored current and operable in a second frequency to generate a trapezoidal pulse.

14. The transmitter circuit of claim 13 wherein the switched capacitor circuit comprises a first switch and second switch coupled to the voltage source, the first and second switch operable responsive to a first and second clock signal, respectively, operating in the first frequency to alternately charge and discharge a first capacitor and to generate the stable reference current.

15. The transmitter circuit of claim 14 wherein the output circuit comprises a third and fourth switch coupled to an output capacitor, the third and fourth switch operable responsive to a third and fourth clock signal, respectively, to alternately charge and discharge the output capacitor.

16. The transmitter circuit of claim 14 wherein the switched capacitor circuit further comprises a first transistor coupled between an operational amplifier circuit and the first switch, the first transistor adapted to receive a dc voltage from the operational amplifier circuit at its gate, and operable responsive to the dc voltage at its gate to provide a current signal to the first switch.

17. The transmitter circuit of claim 14 wherein the first and second switch are operated in a complementary manner to charge and discharge the first capacitor.

18. The transmitter circuit of claim 14 wherein the capacitance of the first capacitor is adjusted to control the magnitude of the stable reference current.

19. A method for generating a trapezoidal pulse, comprising:
   generating a stable reference current using a switched capacitor circuit;
   amplifying the stable reference current to a mirrored current; and
   generating a trapezoidal pulse using the mirrored current.

20. The method of claim 19, further comprising alternately charging and discharging a first capacitor in the switched capacitor circuit to generate the stable reference current.

21. The method of claim 20 further comprising adjusting the capacitance of the first capacitor to control the magnitude of the stable reference current.

22. The method of claim 19 further comprising alternately charging and discharging an output capacitor to generate the trapezoidal pulse.

23. The method of claim 19 further comprising operating the switched capacitor circuit is a first frequency.

24. The method of claim 23 wherein the switched capacitor circuit is coupled to a voltage source.

25. The method of claim 22 wherein the output capacitor is charged and discharged by an output circuit.

26. The method of claim 25 further comprising operating the output circuit in a second frequency.

27. A trapezoidal pulse generator for generating a stable trapezoidal pulse having reduced variations due to temperature and process, comprising:
   a stable reference current source operable to generate a stable reference current;
   a current amplification circuit adapted to receive the stable reference current and operable responsive to the stable reference current to amplify the stable reference current to a mirrored current; and an output circuit coupled to the current amplification circuit and adapted to receive the mirrored current and operable in a second frequency to generate a trapezoidal pulse.

28. The trapezoidal pulse generator of claim 27 wherein the stable reference current source comprises a first switch and second switch coupled to the voltage source, the first and second switch operable responsive to a first and second clock signal, respectively, operating in the first frequency to alternately charge and discharge a first capacitor and to generate the stable reference current.

29. The trapezoidal pulse generator of claim 27 wherein the stable reference current source further comprises a first transistor coupled between an operational amplifier circuit and the first switch, the first transistor adapted to receive a dc voltage from the operational amplifier circuit at its gate, and operable responsive to the dc voltage at its gate to provide a current signal to the first switch.

30. The trapezoidal pulse generator of claim 28 wherein the first and second switch are operated in a complementary manner to charge and discharge the first capacitor.

31. The trapezoidal pulse generator of claim 27 wherein the output circuit comprises a third and fourth switch coupled to an output capacitor, the third and fourth switch operable responsive to a third and fourth clock signal, respectively, to alternately charge and discharge the output capacitor.

32. A trapezoidal pulse generator for generating a stable trapezoidal pulse having $N_\Phi$ phases, where $N_\Phi$ is an integer, comprising:

a switched capacitor circuit coupled to a voltage source and operable in a first frequency to generate a stable reference current;

a current mirror circuit adapted to receive the stable reference current and operable responsive to the stable reference current to amplify the stable reference current to a mirrored current; and an output circuit coupled to the mirror circuit and adapted to receive the mirrored current and operable in a second frequency to generate a trapezoidal pulse having $N_\Phi$ phases.

* * * * *